United States Patent
Kubena et al.

(10) Patent No.: US 11,606,098 B1
(45) Date of Patent: Mar. 14, 2023

(54) COMB ENHANCED OSCILLATOR WITH AM-TO-PM NOISE SUPPRESSION

(71) Applicant: HRL Laboratories, LLC, Malibu, CA (US)

(72) Inventors: Randall L. Kubena, Malibu, CA (US); Walter S. Wall, Malibu, CA (US); Gabriel Virbila, Malibu, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 0 days.

(21) Appl. No.: 17/677,849

(22) Filed: Feb. 22, 2022

Related U.S. Application Data

(60) Provisional application No. 63/152,506, filed on Feb. 23, 2021.

(51) Int. Cl.
| | |
|---|---|
| H03L 7/099 | (2006.01) |
| H03B 5/04 | (2006.01) |
| H03B 5/32 | (2006.01) |
| H03L 7/081 | (2006.01) |

(52) U.S. Cl.
CPC .............. *H03L 7/099* (2013.01); *H03B 5/04* (2013.01); *H03B 5/32* (2013.01); *H03L 7/081* (2013.01)

(58) Field of Classification Search
CPC ....................................................... H03L 7/099
USPC ............................................................ 331/96
See application file for complete search history.

(56) References Cited

U.S. PATENT DOCUMENTS

| | | |
|---|---|---|
| 4,070,635 A | 1/1978 | Healey |
| 4,132,964 A | 1/1979 | Wilcox |
| 7,237,315 B2 | 7/2007 | Kubena |
| 7,459,099 B2 | 12/2008 | Kubena |
| 7,750,535 B2 | 7/2010 | Kubena |
| 7,851,971 B2 | 12/2010 | Chang |
| 8,601,607 B2 | 12/2013 | Hagmann |
| 8,765,615 B1 | 7/2014 | Chang |
| 8,994,465 B1 | 3/2015 | Kubena |
| 10,110,198 B1 | 10/2018 | Kubena |
| 10,389,392 B1 | 8/2019 | Kubena |
| 10,819,276 B1 | 10/2020 | Kubena |
| 11,156,897 B2 | 10/2021 | Kubena |
| 11,239,823 B1 | 2/2022 | Kubena |
| 11,275,099 B1 | 3/2022 | Sorenson |

(Continued)

FOREIGN PATENT DOCUMENTS

| | | |
|---|---|---|
| KR | 10-2008-0044977 | 5/2008 |
| KR | 10-2012-0132987 | 12/2012 |

(Continued)

OTHER PUBLICATIONS

U.S. Appl. No. 16/932,431, Kubena, filed Jul. 17, 2020.

(Continued)

*Primary Examiner* — Joseph Chang

(74) *Attorney, Agent, or Firm* — Ladas & Parry, LLP

(57) ABSTRACT

A comb enhanced oscillator in which a drive signal from a first oscillator is split into two signals. The first signal is applied to a nonlinear resonator producing a phononic frequency comb of equally spaced resonances. The second signal is passed through an amplitude detector and a phase shifter. In one embodiment, the comb is applied to the phase shifter to correct for AM-PM cross-correlation noise and then applied to a phase lock loop (PLL) for locking to a second oscillator. The output of the second oscillator is used as the output of the comb enhanced oscillator.

25 Claims, 6 Drawing Sheets

(56) References Cited

U.S. PATENT DOCUMENTS

| | | |
|---|---|---|
| 2010/0321117 A1 | 12/2010 | Gan |
| 2012/0294319 A1 | 11/2012 | Maleki |
| 2017/0047893 A1 | 2/2017 | Nguyen |
| 2018/0157148 A1 | 6/2018 | Kim |
| 2019/0250198 A1 | 8/2019 | Kubena |
| 2020/0158769 A1 | 5/2020 | Liu |

FOREIGN PATENT DOCUMENTS

| | | |
|---|---|---|
| WO | 2014-018444 | 1/2014 |
| WO | 2019/217668 | 11/2019 |

OTHER PUBLICATIONS

U.S. Appl. No. 17/348,344, Kubena, filed Jun. 15, 2021.
U.S. Appl. No. 16/775,242, Kubena, filed Jan. 28, 2020.
U.S. Appl. No. 16/932,427, Kubena, filed Jul. 17, 2020.
U.S. Appl. No. 16/932,447, Kubena, filed Jul. 17, 2020.
From U.S. Appl. No. 17/348,344 (unpublished, non-publication request filed), Office Action dated Jan. 27, 2022.
From U.S. Appl. No. 17/348,344 (unpublished, non-publication request filed), Notice of Allowance dated Apr. 26, 2022.
From U.S. Appl. No. 16/932,455 (now U.S. Pat. No. 11,156,897), Notice of Allowance dated Jun. 23, 2021.
From U.S. Appl. No. 16/932,455 (now U.S. Pat. No. 11,156,897), Office Action dated Apr. 22, 2021.
PCT International Search Report and Written Opinion from PCT/US2020/051863 dated Jan. 4, 2021.
PCT International Preliminary Report on Patentability Chapter I from PCT/US2020/051863 dated Apr. 7, 2022.
Analog Devices, Phase Detector/Frequency Synthesizer model ADF4002, Norwood, MA, 2006-2015, 20 pages.
Askari, S. et al., "Near-Navigation Grade Quad Mass Gyroscope With Q-Factor Limited by Thermo-Elastic Damping," Solid-State, Actuators, and Microsystems Workshop Technical Digest, Hilton Head, South Carolina, USA, 2016, pp. 254-257.
Bennett, S. P. et al., "Magnetic Field Response of Doubly Clamped Magnetoelectric Microelectromechanical AlN—FeCo Resonators," Applied Physics Letters 111, 252903 (2017), 6 pages.
Bhatia, A. et al., "Linearization of Phase-Modulated Analog Optical Links using a Four-Wave Mixing Comb Source," Optics Express, DOI: 10.1364/OE 22.030899, Dec. 4, 2014, 11 pages.
Chang, et al., "Nonlinear UHF Quartz MEMS Oscillator with Phase Noise Reduction," 26th IEEE International Conference on MicroElectroMechanical Systems, Taipei, Taiwan, Jan. 20-24, 2013, pp. 781-784.
Ganesan, A., et al., "Evidence for Simultaneous Growth and Saturation Mechanisms in Phononic Frequency Combs," IEEE, 2019 Frequency Control Symposium, Orlando, Fl. Apr. 14-18, 2019 (3 pages).
Ganesan, A., et al., "Phononic Frequency Combs for Engineering MEMS/NEMS Devices with Tunable Sensitivity," 2019 IEEE (4 pages).
Ganesan, A. et al., "Phononic Frequency Comb via Intrinsic Three-Way Mixing," Physical Review Letters, PRL 118, 033903 (2017), (5 pages).
Hati, A. et al., "Oscillator PM noise reduction from correlated AM noise," IEEE Transactions on Ultrasonics, Ferroelectrics, and Frequency Control. vol. 63, No. 3 (Mar. 2016): 463-469.
Hati, A., et al., "Reducing oscillator PM noise from AM-PM noise correlation," Electronics Letters, vol. 50, No. 17 (2014): 1195-1197.
Howe, et al., "PM-AM correlation measurements and analysis," May 2012, IEEE International Frequency Control Symposium Proceedings (pp. 1-5).
Hui, Y. et al., "High Resolution Magnetometer Based on a High Frequency Magnetoelectric MEMS-CMOS Oscillator," Journal of Micromechanical Systems, vol. 24, No. 1, Feb. 2015, pp. 134-143.
Kominis, et al., "A subfemtotesla multichannel atomic magnetometer," Nature, vol. 422, pp. 596-599 (2003).
Krislmamoorthy, U., et al., "In-plane MEMS-based Nano-g Accelerometer with Subwavelength Optical Resonant Sensor," Sensors and Actuators A: Physical, 145-146, Jul.-Aug. 2008, pp. 283-290.
Kubena, et al., "A Fully Integrated Quartz MEMS VHF TCXO," 2017 IEEE Frequency Control Symposium, Besancon, FR., pp. 68-71, Jul. 2017.
Kubena, R. L., et a.,"Phononic Comb Generation in High-Q Quartz Resonators," Applied Physics Letters, 116, 053501, Feb. 4, 2020, 5 pages.
Leeson, D. B., et al., "Short-term Stability for a Doppler Radar: Requirements, Measurements, and Techniques," Proceedings of IEEE, vol. 54, No. 2, pp. 244-248, Feb. 1966).
Nan, et.al., "Acoustically Actuated Ultra-Compact NEMS Magnetoelectric Antenna," Nature Communications, 8:296, DOI: 10.1038/s41467-017-00343-8 (2017), pp. 1-8.
Neji, N. et al., FPGA Implementation of the CORDIC Algorithm for Fingerprints Recognition Systems, International Journal of Computer Applications, vol. 63, No. 6, Feb. 2013, pp. 39-45.
Pinto, A. N., "Timing Jitter in Optical Communication Systems," Frontiers in Optics, OSA Technical Digest (CD) (Optical Society of America, 2006), paper FMD5 (1 page).
Roy, S., FPGA implementation of 8-point FFT, May 14, 2019 available on-line at https://digitalsystemdesign.in/fpga-implementation-of-8-point-fft (Printed on Apr. 1, 2022).
Sheng, et al., "A Microfabricated Optically-Pumped Magnetic Gradiometer," Applied Physics Letters 110, 031106 (2017), 5 pages.
Trochimiuk, M., "FPGA programming how it works and where it can be used" available online at https://codilime.com/blog/FPGA-programming-how-it-works-and-where-it-can-be-used/ (Printed on Apr. 1, 2022).
Veryaskin, A. "Gravity, Magnetic and Electromagnetic Gradiometry: Strategic Technologies in the 21st century", IOP ebooks, 2018 (57 pages).
Vrba, J., "SQUID Sensors: Fundamentals, Fabrication and Applications," edited by H. Weinstock, Kluwer Academic, Dordrecht, The Netherlands, 1996, p. 117.
Wall, W. S., et al., "Phase Noise Transfer in High-Q Quartz Phononic Frequency Combs," 2020 IEEE Ultrasonics Sym., Las Vegas, NV, Sep. 6-11, 2020, 4 pages.
Wang, S. et al., "A MEMS Resonant Accelerometer for Low-Frequency Vibration Detection," Sensors and Actuators A: Physical, 283, Nov. 2018, pp. 151-158.
Wenjie, W. et al., "A Nano-g MEMS Accelerometer for Earthquake Monitoring," 19th Intern. Conf. on Solid-State Sensors, Actuators and Microsystems (Transducers), DOI 10.1109/Transducers 2017, pp. 599-602.
Yao, et al., "Bulk Acoustic Wave-Mediated Multiferroic Antennas: Architecture and Performance Bound," IEEE Transactions on Antennas and Propagation, vol. 63, No. 8, Aug. 2015, pp. 3335-3344.
Zhai, J., et al., "Detection of Pico-Tesla Magnetic Fields using Magneto-Electric Sensors at Room Temperature," Applied Physics Letters, 88, 062510 (2006), 5 pages.

COMB ENHANCED OSCILLATOR WITH AM-TO-PM NOISE SUPPRESSION

CROSS REFERENCE TO RELATED APPLICATIONS

This application claims the benefit of U.S. Provisional Patent Application Ser. No. 63/152,506 filed 23 Feb. 2021 and entitled "Comb Enhanced Oscillator with AM-to-PM Noise Suppression Cross", the disclosure of which is hereby incorporated herein by reference.

This application is related to U.S. Provisional Patent Application Ser. No. 63/083,619 filed 25 Sep. 2020 and entitled "Noise Suppression in a Phononic Comb" and to its related non-provisional patent application Ser. No. 17/348,344 filed 15 Jun. 2021, and having the same title as its related provisional application, the disclosures of which are hereby incorporated herein by reference.

This application is also related to the technology disclosed in U.S. Provisional Patent Application Ser. No. 62/904,052, filed 23 Sep. 2019, and entitled "Enhanced Stability Oscillators using a Phononic Comb", and to its related non-provisional patent application Ser. No. 16/932,455, filed 17 Jul. 2020, and having the same title as its related provisional application, the disclosures of which are hereby incorporated herein by reference.

This application is also related to the technology disclosed in U.S. Provisional Patent Application Ser. No. 62/881,069, filed 31 Jul. 2019 and entitled "Phononic Comb Enhanced Gradiometers" and its corresponding non-Provisional U.S. patent application Ser. No. 16/932,431, filed 17 Jul. 2020, and having the same title as its related provisional application, the disclosures of which are hereby incorporated herein by reference.

STATEMENT REGARDING FEDERALLY SPONSORED RESEARCH OR DEVELOPMENT

None.

TECHNICAL FIELD

Phononic Comb Enhanced Oscillators.

BACKGROUND

Reference oscillators are used in radar systems (see, for example, "Short-term Stability for a Doppler Radar: Requirements, Measurements, and Techniques," D. B. Leeson and G. F. Johnson, Proc. of IEEE, Vol. 54, #2, pp. 244-248, Feb. 1966). Particularly for Doppler radar, the ultimate accuracy of the radar is determined by the stability of the reference oscillators. In addition, oscillators are used in communication network systems, GPS, and other navigation and location systems. Low phase noise oscillators determine the limits within many sensor systems and networks, such as under water sonar networks or temperature or pressure resonant-mode sensors. It is estimated that a typical car has over 40 clocks inside to control networks and subsystems. Low phase noise/low timing jitter oscillators are used in frequency synthesizers in software defined radios and other frequency agile digital communication systems and determines the signal-to-noise ratio in analog-to-digital converters (ADCs) and in optical communication links (see Pinto, A. N., "Timing Jitter in Optical Communication Systems," Frontiers in Optics, OSA Technical Digest (CD) (Optical Society of America, 2006), paper FMD5). Each commercial cell phone has a TCXO inside for transmit and receive operations. As higher frequency and higher communication bandwidth systems are developed (e.g., 5G networks and beyond for commercial applications), the need for higher performance and lower c-SWaP clocks is becoming greater.

Low phase noise and timing jitter are required for such reference oscillator used in applications including radar, navigation, and communication. There is a constant need to improve the phase noise and the timing jitter and reduce the c-SWaP of reference oscillators. Nonlinear effects such as Duffing in MEMS resonators have been explored in the past to improve phase noise, and AM-to-PM noise cancellation techniques have been described for a single resonator used within a sustaining circuit as a classical oscillator. See, for example, (i) "Reducing oscillator PM noise from AM-PM noise correlation." Hati, Archita, Craig W. Nelson, and David A. Howe, Electronics letters 50.17 (2014): 1195-1197; (ii) "Oscillator PM noise reduction from correlated AM noise," Hati, Archita, Craig W. Nelson, and David A. Howe. IEEE Transactions on Ultrasonics, Ferroelectrics, and Frequency Control 63.3 (2016): 463-469; and (iii) "Short-term Stability for a Doppler Radar: Requirements, Measurements, and Techniques," D. B. Leeson and G. F. Johnson, Proc. of IEEE, Vol. 54, #2, pp. 244-248, Feb. 1966.

Phononic comb enhanced oscillators have been the subject of a number of patent applications referenced above. This disclosure describes an AM-to-PM noise cancellation technique for a phononic comb enhanced oscillator. The viability of this technique is made possible by the observations at HRL Laboratories of correlation between the AM noise on the drive signal of a phononic comb and the PM noise of the teeth of the comb. By applying a phase correction to the output of the nonlinear resonator used in a phononic comb enhanced oscillator, this noise source can be reduced while maintaining the benefit of reduced electronic noise at far-from-carrier frequencies due to the characteristics of the frequency comb. The benefit of using particular comb teeth showing a low sensitivity to external modulations was described in U.S. Provisional Patent Application Serial No. 62/904,052, filed 23 Sep. 2019, and entitled "Enhanced Stability Oscillators using a Phononic Comb", and in its related non-provisional patent application Ser. No. 16/932,455, filed 17 Jul. 2020, both filed by the assignee of the present application. The presently disclosed noise cancellation technique can also be combined with the signal-to-noise improvement technique for phononic comb teeth as described in U.S. Provisional Patent Application Serial No. 63/083,619 filed 25 Sep. 2020 and entitled "Noise Suppression in a Phononic Comb" and to its related non-provisional patent application Ser. No. 17/348,344 filed 15 Jun. 2021 also filed by the assignee of the present application.

In the prior art, Temperature Controlled Crystal Oscillators (TCXOs) are used in many clock applications for commercial and military systems and have a small size and low power (typically around 15 mm$^3$ and <10 mW, respectively). However, they can drift about 0.2 ppm over temperature and have typical phase noise of −90 dBc/Hz @ 10 Hz and flicker floor noise of around −140 dBc/Hz at 10 kHz. Low cost TCXOs have g-sensitivities of $1\times10^{-9}$/g, and g-hardened TCXOs can have g-sensitivities of $\sim2$-$5\times10^{-11}$/g.

To achieve higher stability over time periods of several seconds to minutes, Ovenized Controlled Crystal Oscillators (OCXOs) have been used. Current miniaturized OCXOs typically have larger volumes of 100 mm$^3$ and use >150 mW of power. They provide temperature stability of <50 ppb and phase noise of around −110 dBc/Hz @ 10 Hz but similar flicker floor noise at higher offset frequencies. However, OCXOs can have higher g-sensitivity than g-hardened TCXOs.

To further improve the temperature stability and phase noise at lower offset frequencies, chip-scale atomic clocks (CSAC) have been developed. However, their size and power are even larger than OCXOs by roughly an order of magnitude and their g-sensitivity can be orders of magnitude worse than a TCXO. Moreover, none of these technologies addresses the reduction of phase noise at higher offset frequencies which determines timing jitter in digital systems. Thus, there is a need for a true chip-scale clock with TCXO power, higher stability than a TCXO, and low g sensitivity.

BRIEF DESCRIPTION OF THE INVENTION

As is described in U.S. Provisional Patent Application Ser. No. 62/904,052, filed 23 Sep. 2019, and entitled "Enhanced Stability Oscillators using a Phononic Comb", and in its related non-provisional patent application Ser. No. 16/932,455, filed 17 Jul. 2020, certain teeth of a phononic comb can show much smaller frequency modulation sensitivity compared to the drive signal (see also "Phononic Comb Generation in High-Q Quartz Resonators," R. L. Kubena, W. S. Wall, J. Koehl, and R. J. Joyce, Applied Physics Letters, 116, 053501, Feb. 4, 2020, the disclosure of which is hereby incorporated herein by reference.) This smaller frequency modulation sensitivity has been shown by HRL Laboratories LLC to reduce phase noise induced on the drive signal (see also "Phase Noise Transfer in High-Q Quartz Phononic Frequency Combs," W. S. Wall, R. L. Kubena, Y. K. Yong, J. Koehl, and R. J. Joyce, 2020 IEEE Ultrasonics Sym., Las Vegas, NV. Sept. 6-11, 2020, the disclosure of which is also hereby incorporated herein by reference.). However, the phase noise of the comb teeth can be affected by amplitude modulation to phase noise modulation (AM to PM) conversion in resonators working in a nonlinear regime. Noise on the amplitude of the drive signal can be converted to phase noise on the teeth. This additional PM noise on the teeth can, however, be reduced since it is correlated with the AM noise on the driving signal. By sensing the AM noise on the drive and using a voltage controlled phase shifter controlled by the AM noise signal, the PM induced noise can be reduced. We have determined that the PM noise on a comb tooth is correlated with the AM noise on the drive signal of a phononic comb generator. We describe herein an architecture and method to incorporate a phase noise correction circuit into an enhanced stability oscillator using a phononic comb.

The technology described herein relates to an architecture and method to reduce the phase noise of teeth of a phononic frequency comb when the drive signal to the nonlinear resonator producing the comb contains amplitude modulation (AM) noise. Recently, it has determined that the AM noise on the drive signal is correlated with the phase modulation (PM) noise on individual teeth within a phononic comb. This observation has not been seen previously.

DETAILED DESCRIPTION

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to (i) all papers and documents which are filed concurrently with this specification and which are open to public inspection with this specification (the contents of all such papers and documents are incorporated herein by reference) and (ii) all papers and documents which are otherwise incorporated by reference herein (but not physically filed with this specification).

All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Figure 1:
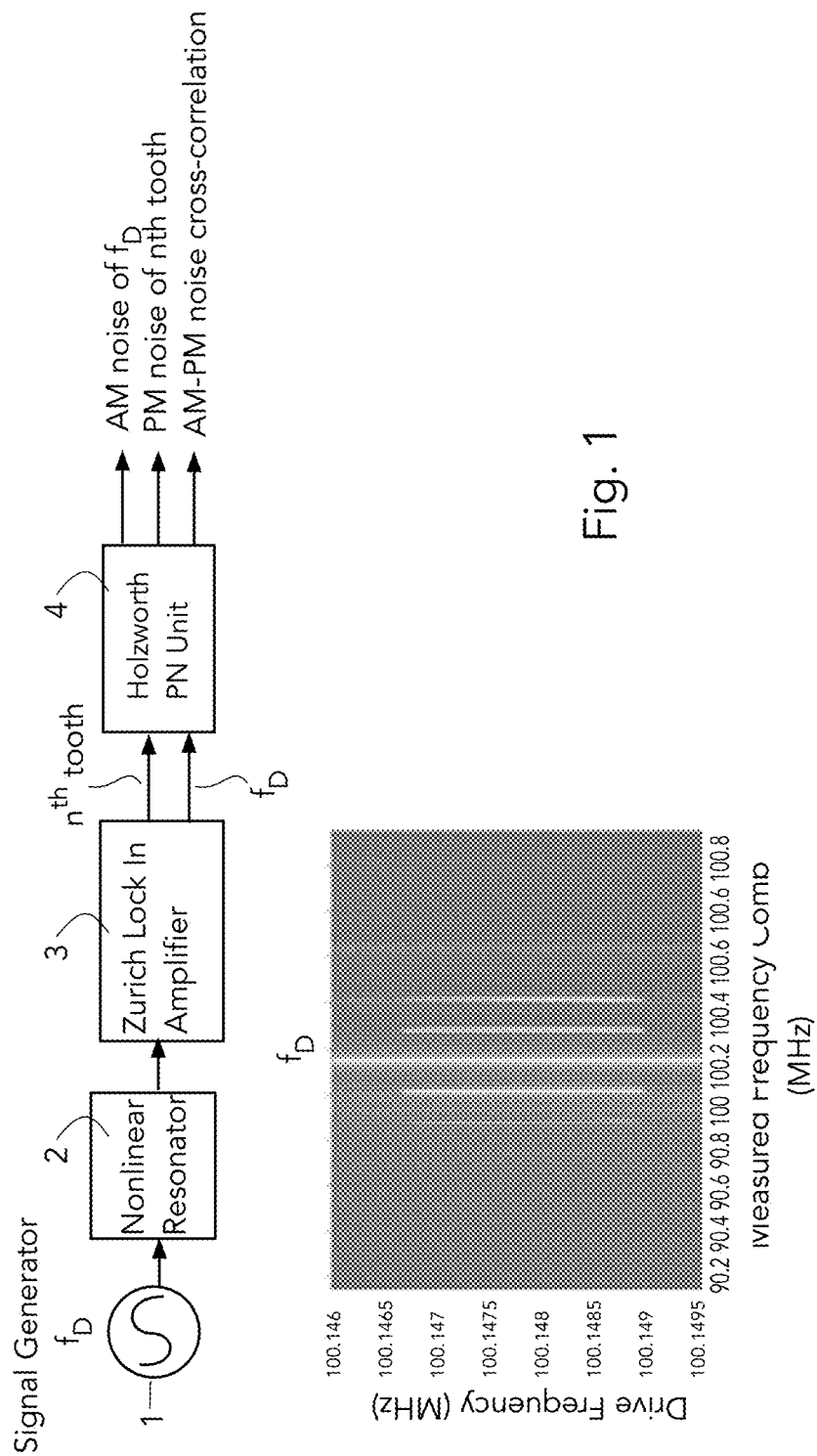
FIG. 1 presents a block diagram block diagram of the measurement to confirm correlation between the AM noise of the drive signal and the PM noise of the first tooth to the right of the drive signal for a phononic comb as shown in the waterfall plot also depicted by FIG. 1.
Figure 2:
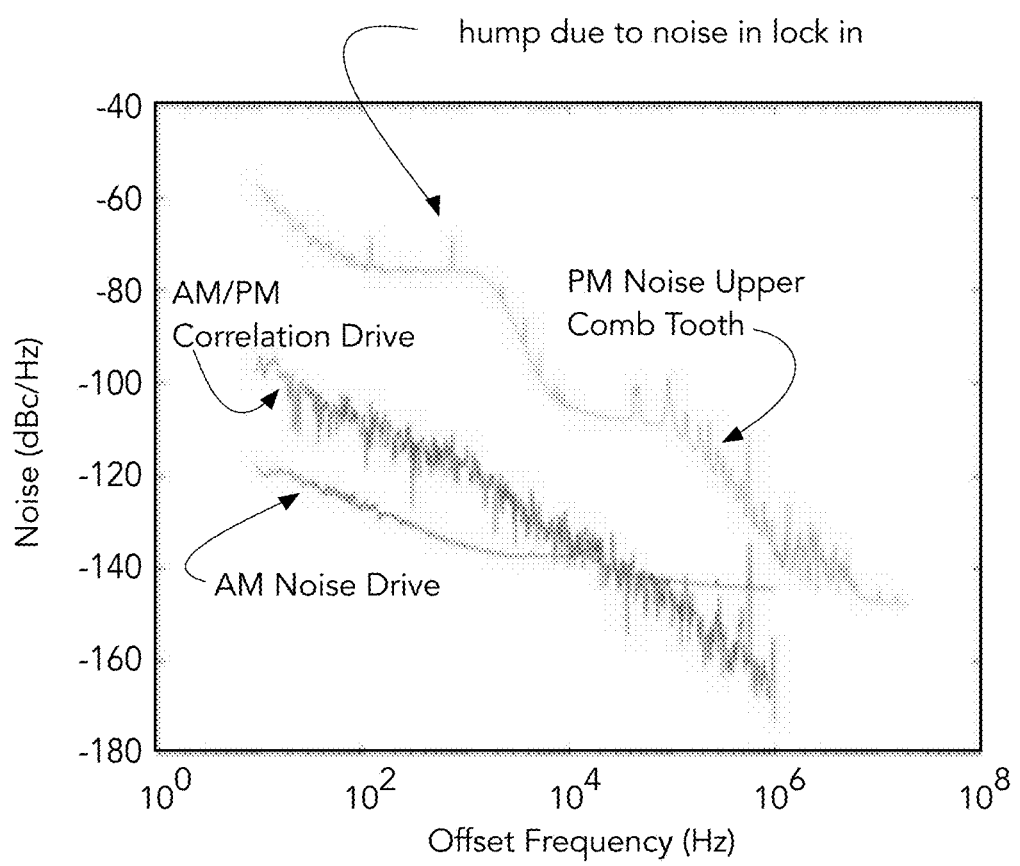
FIG. 2 is a graph depicting the spectra of the AM noise of the drive signal, the PM noise of the upper comb tooth higher in frequency than the drive signal, and their cross-correlation power spectrum. For 100% correlation, the cross-correlation is equal to the geometric mean of the two signals (lying mid-way between the AM and PM noise on a log plot). For zero correlation, the cross-correlation spectrum lies below the AM and PM noise spectra.

We believe that there is a correlation between AM and PM noise and to verify that our belief was in fact correct a test was done using an experimental test set up shown by the block diagram portion of FIG. 1. The experimental set-up measured the cross correlation of the AM noise on the drive signal, the PM noise on the $n^{th}$ tooth, and the cross-correlation between them. In the test set up a signal from a frequency synthesizer 1 was applied to a 100-MHz shear-mode quartz resonator 2 and the frequency and power were adjusted so that the resonator 2 produced a phononic frequency comb (the comb of frequencies is shown on FIG. 1). The phononic frequency comb and its generation is described in U.S. Provisional Patent Application Ser. No. 62/904,052, filed 23 Sep. 2019, and entitled "Enhanced Stability Oscillators using a Phononic Comb", and to its related non-provisional patent application Ser. No. 16/932,455, filed 17 Jul. 2020, the disclosures of which are incorporated herein by reference. The phononic frequency comb near 100 MHz of equally spaced resonances generated by resonator 2 was inputted into a multi-channel lock-in amplifier 3 (made by Zurich Instruments, for example) which can select a single tooth (the $n^{th}$ tooth) of the frequency comb, and its internal references are adjusted to lock to the drive frequency $f_D$ and desired frequency of the $n^{th}$ tooth. These two signals were then inputted into a multi-channel phase noise unit 4 (preferably a model HA7062 by Holzworth Instrumentation, Inc. of Boulder, Colo.) which can perform real-time cross-correlation. The AM modulation noise is measured for the drive frequency, and the PM noise is measured for the $n^{th}$ tooth frequency. The results along with the cross-correlation are shown in FIG. 2.

The cross-correlation of the two signal is computed as $S_{\varphi\alpha}(f)=2/T<\Phi(f)A^*(f)>_m$, where $\varphi(t)$ and $\alpha(t)$ are the instantaneous phase and amplitude fluctuations, $\Phi(f)$ and $A(f)$ are the respective complex Fourier transforms, T is the measurement time normalizing the PSD to 1 Hz, "*" indicates the complex conjugate, and $<>_m$ denotes an ensemble of m averages. The degree of correlation between the PM and AM noise can be described by a correlation function, $\rho=S_{\varphi\alpha}/\sqrt{S_\varphi S_\alpha}$. The values of $\rho$ range from 0 to 1, with $\rho=1$ representing 100% correlation. It can be determined from the data presented at FIG. 2, that our measured correlation is approximately 32%. However, it was also observed that the Zurich lock-in amplifier added >10-15 dBc/Hz of phase noise to the signal generator waveform when the signal source was measured directly with the Holzworth system compared to when the signal generator waveform was passed through the Zurich prior to being measured by a multi-channel phase noise unit made by Holzworth. With a lower noise PLL, one might well expect to a higher degree of correlation.

This cross correlation is not desirable since it adds additional phase noise to the system if AM to PM noise conversion processes exist. These processes can be driven by stress mitigated conversion of voltage noise on the drive to phase noise through duffing effects or can be driven by thermal noise conversion of the power input noise to phase noise through the temperature dependence of the comb teeth. The embodiments of FIGS. 3a and 3b can reduce the conversion noise in both cases. In order to achieve a frequency tooth comb from the Non-Linear Crystal Oscillator (NLXO) of FIGS. 3a and 3b, we apply approximately $10^5$ times the power into the resonator in the NLXO in order to cause the non-linear effect (the comb generation) to occur compared to how a resonator might typically be driven (without the non-linear effect of comb generation be realized), so the AM to PM noise cross-correlation can result in a larger AM to PM noise conversion than with a conventional resonator embodied clock generator. Selection of a particular tooth (the $n^{th}$ tooth) is discussed in the patent supplications and papers referenced above.

Figure 3A:
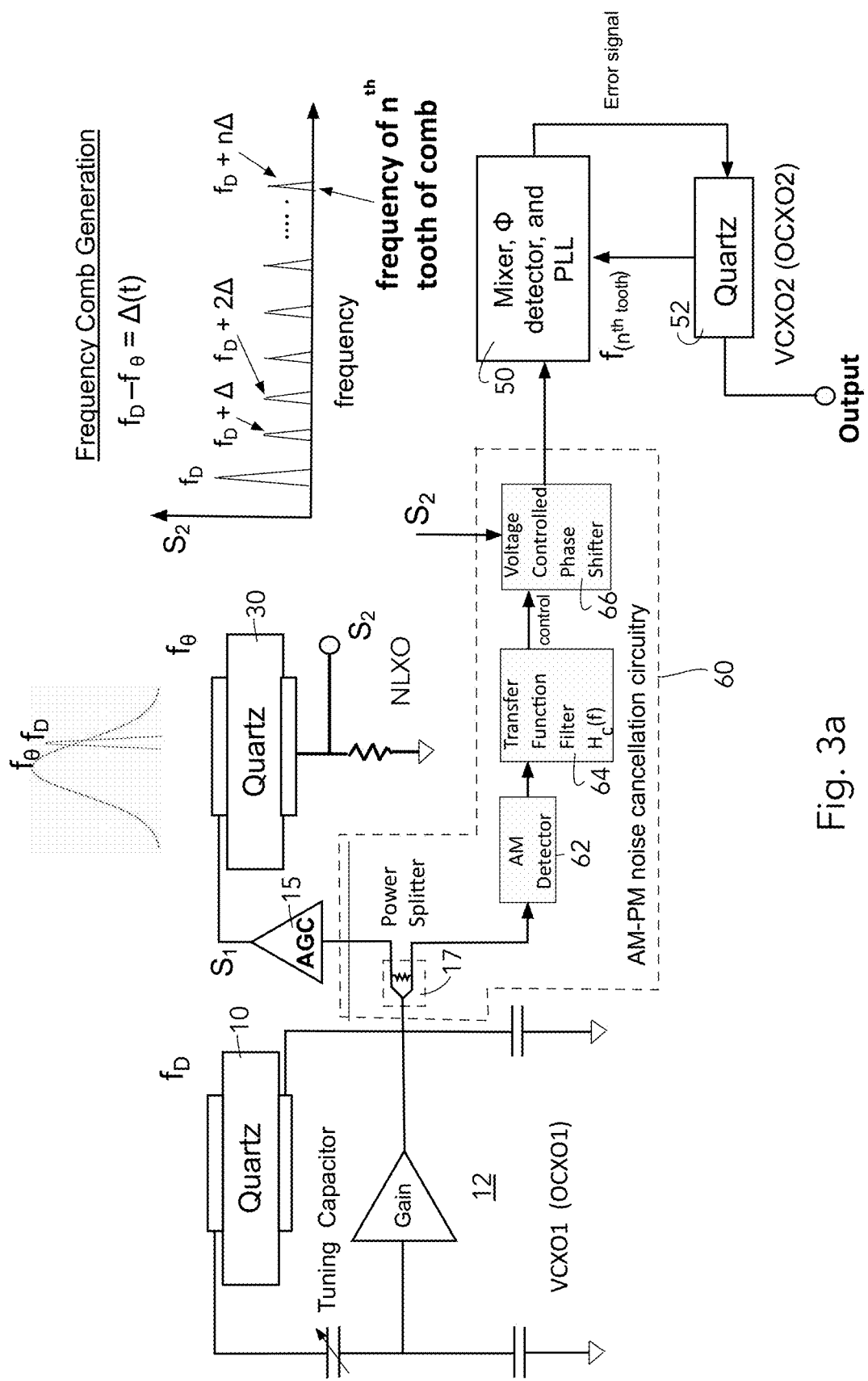
FIGS. 3a and 3b depict embodiments of a comb-enhanced TCXO or OCXO with AM-PM noise cancellation.
Figure 3B:
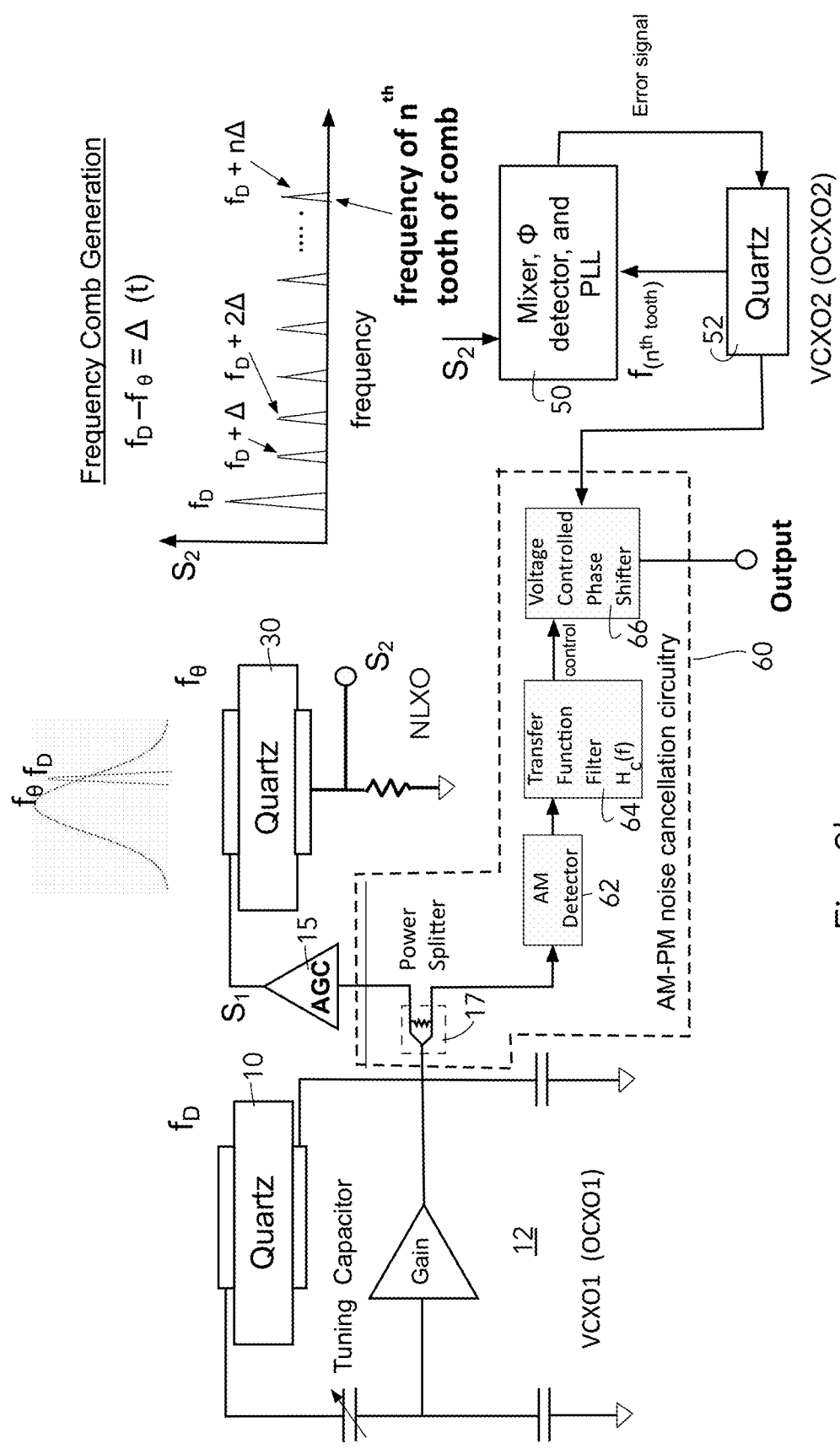

Given the fact that the AM noise on the drive is correlated to at least some degree with the PM noise of the teeth, we now describe two embodiments of an improved phononic comb oscillator, shown in FIGS. 3a and 3b, for reducing this correlated phase noise within a phononic comb enhanced oscillator. The basic oscillator circuit (without the improvements to reduce the cross correlation of the AM and PM noise) has been described in in U.S. Provisional Patent Application Ser. No. 62/904,052, filed 23 Sep. 2019, and entitled "Enhanced Stability Oscillators using a Phononic Comb", and its related non-provisional patent application Ser. No. 16/932,455, filed 17 Jul. 2020. However, that circuit is modified as is described herein by using a power splitter 17 at the output of resonator 10 of VCXO1 to allow an AM envelope detector 62 (which can comprise a diode, and DC blocking capacitor, and a band pass filter, but other implementations are certainly possible) to detect the amplitude of the drive signal as split by splitter 17 from VCXO1 (and resonator 10) and apply a calibrated voltage spectrum based thereon to a voltage controlled phase shifter 66 frequency comb preferably using a transfer function controller (filter Hc(f)) 64. Calibration of the voltage applied to the phase shifter 66 is discussed below. The voltage controlled phase shifter 66 may be embodied by a voltage controlled phase shifter such as (or similar to) model JSPHS-150 made by Mini-Circuits of Brooklyn, N.Y.

Calibration is accomplished by measuring the phase shift produced by the phase shifter 66 for a known voltage output from the AM envelope detector 62 along with using the measured output phase noise of a particular tooth (the selected or $n^{th}$ tooth). The voltage applied to the phase shifter 66 may be adjusted using an adjustable gain IF amplifier (not shown) between the AM detector 62 and the phase shifter 66. In the embodiments such as those depicted by FIG. 3a or 3b, the filter 64 may be embodied as a Finite Impulse Filter (FIR) or Infinite Impulse Filter (IIR) or alternatively as a Field Programmable Gate Array (FPGA). Programming a FIR or IIR filter to have the proper response., i.e., a 20 dB/dec roll off with a 180° phase shift above the 3 dB roll off frequency can be difficult. One can get close to the desired $1/f^2$ response, but not exactly for a stable filter design. That is why a FPGA filter embodiment of filter 64 (shown in FIG. 4) is preferred.

Filter 64 may be omitted altogether in some embodiments and without filter 64, one can then optimize the phase noise at one particular offset frequency, but this may have somewhat limited utility in many applications. In order to correct the phase noise over a wide offset frequency range, filter 64 should be included in the comb enhanced oscillator with AM-to-PM noise suppression described herein. The output of filter 64, if utilized, is applied to the voltage control input of phase shifter 64, but if the filter 64, is omitted, then the output of the AM envelope detector 62 is applied to the voltage control input of phase shifter 64.

The output of the nonlinear resonator 30 producing the phononic comb is applied to the signal input port of the phase shifter 64 in the embodiment of FIG. 3a or to an input port of a Phase Locked Loop (PLL) 50 in the embodiment of FIG. 3b. In the embodiment of FIG. 3a, the frequency comb is then corrected by the phase shifter 66 and used as the input to the Phase Locked Loop (PLL) 50. The PLL 50 locks to a particular tooth set by a second reference oscillator VCXO2 (see resonator 52). Thus, the correlated AM-PM noise can be removed and/or reduced, and the VCXO2 phase noise can be improved compared to that of VCXO1 particularly if a tooth (a desired or $n^{th}$ tooth) with a higher slope than the drive frequency is selected (as seen in a waterfall plot of the frequency of the drive versus the frequency of the teeth). This is expected to primarily reduce the far-out phase noise produced by the sustaining circuit 12 used in VCXO1. The AM envelope detector 62, the filter Hc(f) 64 and the voltage-controlled phase shifter 66 may be collectively referred to as AM-PM noise cancellation circuitry 60 herein.

Various embodiments of PLL 50 are well known with one embodiment of same including associated electronics may be provided, at least in part, by a Phase Detector/Frequency Synthesizer model ADF4002 made by Analog Devices of Norwood, Mass. Other PPL designs may alternatively be used by those skilled in the art.

The drive signal $S_1$ ($f_D$) generated by VCXO1 is applied to the resonator 30 of the Non-Linear Oscillator Circuit (NLXO) with sufficient gain to cause it to resonate in a non-linear fashion, in this case producing a frequency comb on either side of the drive signal $S_1$ See the graph of FIG. 1. Gain may be added as needed to the split signal from the splitter 17 by an amplifier 15, which may be embodied as an Automatic Gain Control (AGC) circuit. The phononic frequency comb produced by the NLXO is denoted as signal $S_2$ on FIGS. 3*a* and 3*b*.

The embodiment of FIG. 3*b* is similar to that of FIG. 3*a*, but differs in that signal $S_2$ (the phononic comb) is applied to signal input of voltage controller phase shifter 66 in the embodiment of FIG. 3*a* as opposed to the PLL 50 as in the case of the embodiment of FIG. 3*b*. In FIG. 3*b* the output of resonator 52 in VCXO2 associated with PLL 50 is applied as a control input to the voltage controller phase shifter 66 as opposed to providing an output of the improved oscillator as in the case of the embodiment of FIG. 3*a*. In the embodiment of FIG. 3*b* the output of the improved oscillator is taken from the voltage controller phase shifter 66 whereas in the embodiment of FIG. 3*a* the output of the voltage controller phase shifter 66 is applied to PLL 50.

In the embodiment of FIG. 3*a* a phase shift is applied by phase shifter 66 to the entire comb (all the teeth) and then the PLL 50 subsequently selects the desired or selected ($n^{th}$ tooth) tooth, most likely the selected tooth being the tooth with the lowest phase noise. The needed calibration in the AM to PM noise cancellation circuit 60 will only be correct for that one selected tooth however. In addition, intermodulation within the phase shifter might introduction extra noise on the comb. In the embodiment of FIG. 3*b*, the correction phase shift is only applied to the signal stabilized by one tooth after being selected by the PLL 50. Again, the selected ($n^{th}$ tooth) tooth would most likely be the tooth exhibiting the lowest phase noise. At present it is felt that the embodiment of FIG. 3*b* is preferred.

The filter 64 is designed to transfer the AM noise spectrum to the appropriate spectral response of the resulting PM noise. For example, white AM noise on the drive will be converted to white frequency noise on the teeth which is mathematically equivalent to $1/f^2$ phase noise on the comb teeth. $1/f$ AM noise on the drive signal $f_D$ will be converted to $1/f$ phase noise on the comb teeth, etc. In general, the filter response of filter 64 should add an additional $1/f^2$ roll off to the AM noise spectrum. However, to obtain an optimized correction of the AM-to-PM noise conversion, a more complicated filtering function appears to be needed than can be provided by FIRs or IIRs as a filter 64 implementation, which will bring us to a FPGA embodiment of the filter 64 which is now described below.

The $H_c(f)$ transfer function filter 64 is used to tailor the AM noise power spectrum to that of PM noise profile. In most cases, the AM noise is fairly flat over frequency near the carrier while the PM noise can fall off as $1/f^n$, where n=3, 2, or 1. In addition, in order to cancel the AM induced noise, the AM noise cancellation signal should be inverted in polarity compared to the original measured envelope. As noted above, the transfer function may be embodied as a FIR or IIR filter with the proper poles and zeros to filter and invert the AM noise before it is applied to phase shifter 66. However, other implementations or embodiments are possible using a FPGA (as mentioned above) or a DSP (as mentioned below), for example, for a more complex filter response, is believed to be more desirable. The $H_c(f)$ transfer function filter 64 may be embodied by a FPGA (or a DSP) and a FPGA embodiment of the $H_c(f)$ transfer function filter 64 is describe below with reference to FIG. 4.

FPGA programming is a well-known skill in the art, and thus is not described herein (see, for example, M. Trochimiuk, "FPGA programming how it works and where it can be used" available online at codilime.com/blog/FPGA-programming-how-it-works-and-where-it-can-be-used/). The rationale for using a FPGA as opposed to a FIR or IIR design was that given the particular correction signal spectrum (see FIG. 2) the best phase noise reduction for the frequency comb could not easily be produced by a simple analog IIR or FIR filter. The downside of using an FPGA is that the power requirements for the oscillator will be much higher and the time delay may be also greater than using an analog filter. So ultimately one may want to design a low power Application Specific Integrated Circuit (ASIC) to implement in a custom design what the FPGA is doing in implementing the filter design of FIG. 4.

Figure 4:
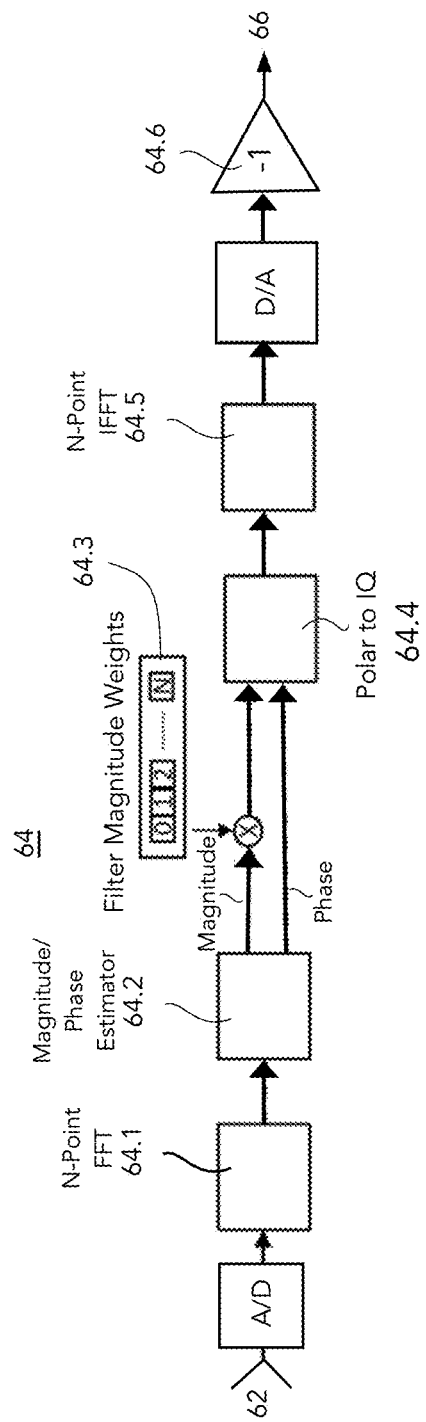
FIG. 4 depicts an embodiment of the Hc(f) filter of FIGS. 3a and 3b.

FIG. 4 shows an FPGA embodiment of the transfer function filter Hc(f) 64 for use in the improved phononic comb oscillator embodiments of FIGS. 3*a* and 3*b*, the transfer function filter Hc(f) 64 embodied by a FPGA provides a more robust and/or more stable transfer function Hc(f) filter 64 than the FIR and/or IIR embodiments mentioned above. With the FPGA approach of FIG. 4, the incoming time domain signal from AM amplitude detector 62 is mapped to the frequency domain through an N-Point Fast Fourier Transform (FFT) circuit 64.1 via an analog to digital to convertor ADC (A/D). The size of the N-Point FFT 64.1 depends on the desired frequency resolution and signal's sampling rate. Once in the frequency domain, the signal's magnitude and phase is estimated using a Magnitude/Phase Estimator circuit 64.2 which may be implemented as a Coordinate Rotation Digital Computer (CORDIC). A FFT and a CORDIC may be implemented by a FPGA (see Nihel Neji et al, FPGA Implementation of the CORDIC Algorithm for Fingerprints Recognition Systems, *International Journal of Computer Applications*, Volume 63, No. 6, February 2013 and Shirshendu Roy, FPGA implementation of 8-point FFT, 14 May 2019 available on-line at digitalsystemdesign.in/fpga-implementation-of-8-point-fft). The phase of the original incoming signal is preferably maintained, while the magnitude is multiplied (see elements 64.2 and 64.3) with frequency dependent weights generated from a look up table of size N (preferably the same N as in the N-Point FFT and IFFT of elements 64.1 and 64.5) for the desired frequency response of filter 64. This desired frequency response may be determined by an iterative process during initial set-up for optimizing the output phase noise.

Using the new (weighted) magnitude frequency response and the signal's original phase, the frequency domain signal is mapped back to a complex number in Cartesian format (see element 64.4) and converted back to the time domain through an N-Point IFFT 64.5. The time domain signal now has the original phase but has been filtered with desired magnitude response described above with reference to FIG. 2. The signal is then multiplied by −1 after being converted back to the analog domain by a digital to analog convertor (see the DAC) which multiplication is equivalent to 180° phase shift. The 180° phase shift or any desired phase shift can alternatively be done on the signal's phase when in polar format before converting back to Cartesian format thereby obviating a need for the −1 multiplication. This approach just described allows for generation of more complex filtering responses that would not otherwise be possible using a more traditional, IIR or FIR approach.

The ADC and DAC devices shown on FIG. 4 may be embodied with commercially available FPGAs made by, for example, by Xilinx of San Jose, Calif. The DAC and DAC would also be utilized with an FIR or IIR filter embodiment and may well be embodied with the FIR or IIR in such embodiments. The FPGA when programmed as depicted by FIG. 4 may be thought of as a programmed Digital Signal Processor (DSP). A custom DSP also could be used to implement the functionality depicted by FIG. 4.

Figure 5:
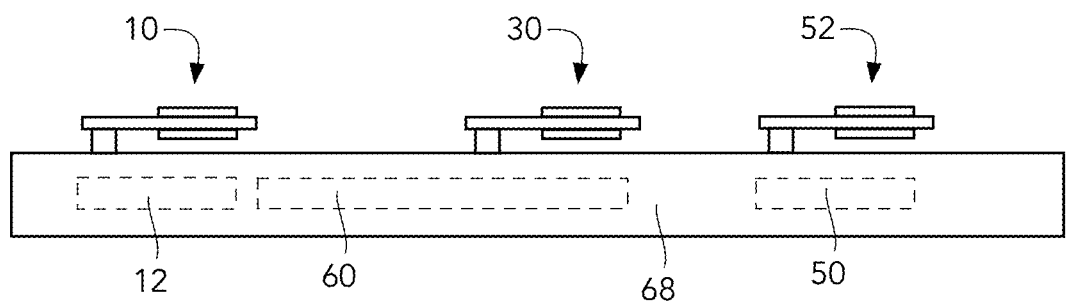
FIG. 5 is a schematic diagram of the resonators and circuits of FIG. 3a or 3b integrated on a single semiconductor substrate.

The nonlinear resonator 30 can be any multi-mode RF resonator operating in a nonlinear fashion, but preferably it is a MEMS-based resonator. MEMS-based resonators can be formed from various materials such as Si, PZ 1, AlN, or quartz. For quartz resonators, various cut angles are typically utilized for temperature compensation. AT-cut quartz is used for TCXOs which are typically stable to within 0.1 to 0.2 ppm over a temperature range of −40 to +85° C. SC-cut quartz shear-mode resonators are used for OCXOs in which the resonator and electronics are ovenized near 90° C. MEMS-based resonators 10, 30 and 52 can be integrated with sustaining circuits (such as sustaining circuit 12) and additional electronics (such as the AM-PM noise cancellation circuit 60 and PLL 50) so that the comb enhanced oscillator may be integrated on a single semiconductor substrate 68 as depicted by FIG. 5. The substrate 68 may be formed from a convenient semiconductor material such as Si. Resonators 10 and 52 of VCXO1 and VCXO2 may also be MEMS-based resonators formed from various materials such as GaN, Si, PZT, AN, or quartz. For quartz resonators, a HRL Laboratories, LLC quartz MEMS process can be used for integration. See U.S. Pat. Nos. 7,237,315, 7,459,099, and 7,750,535 the disclosures of which are incorporated herein by reference.

This document describes improving clock performance using a phononic frequency comb with additional circuit components to reduce AM/PM noise. It is not limited to only phononic combs produced in a quartz resonator, rather this technology may be applied to other resonator types (i.e., GaN, Si, AN, SiC, etc.) having suitable nonlinear properties.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Section 112, as it exists on the date of filing hereof, unless the element is expressly recited using the phrase "means for . . . " and no method or process step herein is to be construed under those provisions unless the step, or steps, are expressly recited using the phrase "comprising the step(s) of . . . ."

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

What is claimed is:

1. A comb enhanced oscillator comprising:
   a. a first oscillator for generating a drive signal;
   b. a signal splitter for splitting the drive signal into first and second signals;
   c. a nonlinear resonator responsive to the first signal for producing a phononic frequency comb;
   d. an AM-PM noise correction circuit including at least an amplitude detector and a phase shifter, the amplitude detector of the AM-PM noise correction circuit being responsive to the second signal and the phase shifter being responsive to both the amplitude detector and the phononic frequency comb, the AM-PM noise correction circuit generating a noise correction circuit output signal; and
   e. a phase locked loop (PLL) and a second oscillator, the PLL being responsive to the noise correction output signal for locking the second oscillator to a particular tooth of the phononic frequency comb, the second oscillator providing an output of the comb enhanced oscillator.

2. The oscillator of claim 1 in which the amplitude detector of said AM-PM noise correction circuit has an output coupled with a control function that is applied between the output of the amplitude detector and an input of the phase shifter in order to adjust phase and amplitude of the output thereof applied to the input of the phase shifter for reducing and/or cancelling phase noise caused by AM-PM cross-correlated noise, the control function including a Finite Impulse Filter (FIR), an Infinite Impulse Filter (IIR), a Field Programmable Gate Array (FPGA) or a Digital Signal Processor (DSP).

3. The oscillator of claim 2 wherein a FPGA or DSP implementing the control function is programmed and/or embodied to include:
   a. an analog to digital convertor coupled to an output of the amplitude detector;
   b. an N-Point Fast Fourier Transform (FFT) circuit coupled to an output of the analog to digital convertor;

c. a Magnitude/Phase Estimator coupled to an output of the FFT circuit, the Magnitude/Phase Estimator having magnitude and phase outputs;
d. a multiplier coupled with a table of magnitude weighting values and with magnitude values provided by the Magnitude/Phase Estimator circuit at its magnitude output for weighting magnitude values provided by the Magnitude/Phase Estimator circuit with associated magnitude weighting values in said table;
e. a Polar to Cartesian coordinate converter for converting weighted magnitude values from the multiplier and the phase values from the Magnitude/Phase Estimator to Cartesian or IQ coordinate values;
f. N-Point Inverse Fast Fourier Transform (IFFT) circuit coupled to receive the Cartesian or IQ coordinate values from the Polar to Cartesian coordinate converter; and
g. a digital to analog convertor coupled to an output of the amplitude N-Point Inverse Fast Fourier Transform (IFFT) circuit.

4. The comb enhanced oscillator of claim 1 in which the nonlinear resonator is a MEMS resonator.

5. The comb enhanced oscillator of claim 4 in which the nonlinear resonator is a quartz resonator and is, in use, driven by the first oscillator with sufficient energy to enter a non-linear state with said frequency comb having equally spaced resonances.

6. The comb enhanced oscillator of claim 5 in which the nonlinear resonator is a SC or AT-cut quartz shear-mode resonator.

7. The comb enhanced oscillator of claim 4 in which either or both the first oscillator and the second oscillator are MEMS-based oscillators.

8. The comb enhanced oscillator of claim 7 in which the first and second oscillator and the nonlinear resonator are integrated on a single substrate.

9. The comb enhanced oscillator of claim 8 in which the substrate is comprised of a semiconductor material.

10. The comb enhanced oscillator of claim 9 in which the substrate material is Si.

11. The comb enhanced oscillator of claim 8 in which electronics for the first oscillator, the second oscillator, the nonlinear resonator, the AM-PM correction circuit, and the PLL are also integrated on a common single substrate.

12. A comb enhanced oscillator comprising:
a. a first oscillator for generating a drive signal;
b. a signal splitter for splitting the drive signal into first and second signals;
c. a nonlinear resonator responsive to the first signal for producing a phononic frequency comb;
d. an AM-PM noise correction circuit including at least an amplitude detector and a phase shifter, the amplitude detector of the AM-PM noise correction circuit being responsive to the second signal and the phase shifter being responsive to the amplitude detector and a selected tooth of the phononic frequency comb, the AM-PM noise correction circuit providing an output of the comb enhanced oscillator; and
e. a phase locked loop (PLL) and a second oscillator, the PLL being responsive to the phononic frequency comb for locking the second oscillator to said selected tooth of the phononic frequency comb, the second oscillator providing an input to the phase shifter of the AM-PM noise correction circuit.

13. The comb enhanced oscillator of claim 12 in which the amplitude detector of said AM-PM noise correction circuit has an output coupled with a control function that is applied between the output of the amplitude detector and an input of the phase shifter in order to adjust phase and amplitude of the output thereof applied to the input of the phase shifter for reducing and/or cancelling phase noise caused by AM-PM cross-correlated noise, the control function including a Finite Impulse Filter (FIR), an Infinite Impulse Filter (IIR), a Field Programmable Gate Array (FPGA) or a Digital Signal Processor (DSP).

14. The oscillator of claim 13 wherein a FPGA or DSP implementing the control function is programmed and/or embodied to include:
a. an analog to digital convertor coupled to an output of the amplitude detector;
b. an N-Point Fast Fourier Transform (FFT) circuit coupled to an output of the analog to digital convertor;
c. a Magnitude/Phase Estimator coupled to an output of the FFT circuit, the Magnitude/Phase Estimator having magnitude and phase outputs;
d. a multiplier coupled with a table of magnitude weighting values and with magnitude values provided by the Magnitude/Phase Estimator circuit at its magnitude output for weighting magnitude values provided by the Magnitude/Phase Estimator circuit with associated magnitude weighting values in said table;
e. a Polar to Cartesian coordinate converter for converting weighted magnitude values from the multiplier and the phase values from the Magnitude/Phase Estimator to Cartesian or IQ coordinate values;
f. N-Point Inverse Fast Fourier Transform (IFFT) circuit coupled to receive the Cartesian or IQ coordinate values from the Polar to Cartesian coordinate converter; and
g. a digital to analog convertor coupled to an output of the amplitude N-Point Inverse Fast Fourier Transform (IFFT) circuit.

15. The comb enhanced oscillator of claim 12 in which the nonlinear resonator is a MEMS resonator.

16. The comb enhanced oscillator of claim 15 in which the nonlinear resonator is a quartz resonator and is, in use, driven by the first oscillator with sufficient energy to enter a non-linear state with said frequency comb having equally spaced resonances.

17. The comb enhanced oscillator of claim 16 in which the nonlinear resonator is a SC or AT-cut quartz shear-mode resonator.

18. The comb enhanced oscillator of claim 15 in which either or both the first oscillator and the second oscillator are MEMS-based oscillators.

19. The comb enhanced oscillator of claim 18 in which the first and second oscillator and the nonlinear resonator are integrated on a single substrate.

20. The comb enhanced oscillator of claim 19 in which the substrate is comprised of a semiconductor material.

21. The comb enhanced oscillator of claim 20 in which the substrate material is Si.

22. The comb enhanced oscillator of claim 19 in which electronics for the first oscillator, the second oscillator, the nonlinear resonator, the AM-PM correction circuit, and the PLL are also integrated on a common single substrate.

23. A method of improving an output signal of an oscillator circuit having a first oscillator and a nonlinear resonator responsive to the first oscillator for producing a phononic frequency comb, the method comprising:
a. splitting off a portion of a signal generated by the first oscillator;

b. applying the portion of the signal generated by the first oscillator to a first circuit having at least an amplitude detector and a phase shifter; and c. applying either an output of the nonlinear resonator to said phase shifter or a selected tooth of the output of the nonlinear resonator to said phase shifter.

24. The method of claim 23 wherein an output of the first circuit providing either an input to a second circuit or an output of the oscillator circuit, the second circuit having a phase locked loop (PLL) and a second oscillator, the PLL being responsive to either the output of the first circuit or to the nonlinear resonator for locking the second oscillator to a selected tooth of the phononic frequency comb, the second oscillator providing either an output of the oscillator circuit or an input to the phase shifter of the first circuit.

25. The method of claim 24 wherein the first circuit includes a calibrated control function that is applied between an output of the amplitude detector and an input of the phase shifter for adjusting phase and amplitude of the output thereof applied to the input of the phase shifter for reducing and/or cancelling phase noise caused by AM-PM cross-correlated noise.

* * * * *